(12) United States Patent
Lee et al.

(10) Patent No.: US 11,284,515 B2
(45) Date of Patent: Mar. 22, 2022

(54) ELECTRONIC COMPONENT EMBEDDED SUBSTRATE

(71) Applicant: SAMSUNG ELECTRO-MECHANICS CO., LTD., Suwon-si (KR)

(72) Inventors: Seung Eun Lee, Suwon-si (KR); Jin Won Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 175 days.

(21) Appl. No.: 16/810,034

(22) Filed: Mar. 5, 2020

(65) Prior Publication Data
US 2021/0185822 A1    Jun. 17, 2021

(30) Foreign Application Priority Data
Dec. 16, 2019    (KR) .......................... 10-2019-0167953

(51) Int. Cl.
*H05K 1/18*    (2006.01)
*H05K 1/11*    (2006.01)
(Continued)

(52) U.S. Cl.
CPC ......... *H05K 1/186* (2013.01); *H01L 21/4857* (2013.01); *H01L 21/6835* (2013.01);
(Continued)

(58) Field of Classification Search
CPC ...... H05K 1/186; H05K 1/115; H05K 3/4682; H05K 3/4038; H05K 2201/10015;
(Continued)

(56) References Cited

U.S. PATENT DOCUMENTS

2007/0035015 A1\* 2/2007 Hsu ...................... H01L 23/5389
257/723
2008/0304237 A1\* 12/2008 Shiraishi ................ H05K 1/186
361/702
(Continued)

FOREIGN PATENT DOCUMENTS

JP    2010-153438 A    7/2010
JP    5229401 B2    7/2013
(Continued)

*Primary Examiner* — Andargie M Aychillhum
(74) *Attorney, Agent, or Firm* — Morgan, Lewis & Bockius LLP

(57) ABSTRACT

An electronic component-embedded substrate includes a first wiring layer, a first electronic component disposed on the first wiring layer, a first insulating material covering at least a portion of each of the first wiring layer and the first electronic component, a second wiring layer disposed on the first insulating material, a second electronic component disposed on the second wiring layer and connected to the first electronic component in an electrical parallel connection, a second insulating material disposed on the first insulating material and covering at least a portion of each of the second wiring layer and the second electronic component, and a first via penetrating through the first insulating material and connecting the first electronic component and the second wiring layer.

20 Claims, 10 Drawing Sheets

(51) Int. Cl.
  *H01L 23/498* (2006.01)
  *H01L 25/16* (2006.01)
  *H01L 21/683* (2006.01)
  *H01L 21/48* (2006.01)
  *H05K 3/46* (2006.01)
  *H05K 3/40* (2006.01)
  *H01L 23/00* (2006.01)

(52) U.S. Cl.
  CPC .. *H01L 23/49822* (2013.01); *H01L 23/49838* (2013.01); *H01L 25/16* (2013.01); *H05K 1/115* (2013.01); *H05K 3/4038* (2013.01); *H05K 3/4682* (2013.01); *H01L 23/49816* (2013.01); *H01L 24/16* (2013.01); *H01L 2221/68345* (2013.01); *H01L 2221/68359* (2013.01); *H01L 2224/16235* (2013.01); *H01L 2924/19041* (2013.01); *H01L 2924/19102* (2013.01); *H05K 2201/10015* (2013.01); *H05K 2201/10734* (2013.01)

(58) Field of Classification Search
  CPC ......... H05K 2201/10734; H05K 1/185; H05K 1/0271; H05K 3/4644; H05K 3/4697; H01L 23/49838; H01L 25/16; H01L 21/6835; H01L 21/4857; H01L 23/49822; H01L 2221/68359; H01L 24/16; H01L 2224/16235; H01L 2924/19102; H01L 2924/19041; H01L 23/49816; H01L 2221/68345
  USPC ......................................................... 361/761
  See application file for complete search history.

(56) References Cited

U.S. PATENT DOCUMENTS

| | | | |
|---|---|---|---|
| 2012/0236508 A1* | 9/2012 | Arai | H05K 1/186 361/728 |
| 2013/0037950 A1* | 2/2013 | Yu | H01L 23/5389 257/738 |
| 2013/0082399 A1* | 4/2013 | Kim | H01L 24/81 257/774 |
| 2015/0257275 A1* | 9/2015 | Kusama | H05K 1/185 174/260 |
| 2016/0353576 A1* | 12/2016 | Kusama | H01L 23/49827 |
| 2017/0231094 A1* | 8/2017 | Blackshear | H05K 1/185 |
| 2018/0145033 A1* | 5/2018 | Yl | H01L 24/25 |

FOREIGN PATENT DOCUMENTS

| | | |
|---|---|---|
| KR | 10-2010-0080633 A | 7/2010 |
| KR | 10-1155624 B1 | 6/2012 |

\* cited by examiner

ELECTRONIC COMPONENT EMBEDDED SUBSTRATE

CROSS-REFERENCE TO RELATED APPLICATION(S)

The present application claims the benefit of priority to Korean Patent Application No. 10-2019-0167953 filed on Dec. 16, 2019 in the Korean Intellectual Property Office, the entire disclosure of which is incorporated herein by reference.

BACKGROUND

1. Field

The present disclosure relates to an electronic component-embedded substrate.

2. Description of Related Art

Recently, electronic devices are required to have high performance and high functionality, as well as miniaturization and thinning of electronic device sizes. Accordingly, the number of electronic components to be mounted on the printed circuit board is increasing, but the number of electronic components that may be mounted on the surface of the printed circuit board is limited. For example, the size of printed circuit boards is also required to decrease as the size and thickness of electronic devices decrease. Therefore, a technology for an electronic component-embedded substrate in which electronic components such as passive elements and active elements are embedded in a printed circuit board has been developed.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide an electronic component-embedded substrate having a shortened electrical connection path.

An aspect of the present disclosure is to provide an electronic component-embedded substrate having improved power integrity (PI) characteristics due to an increase in capacitance of an electronic component and/or a decrease in equivalent series inductance (ESL).

An aspect of the present disclosure is to provide an electronic component-embedded substrate in which warpage is reduced.

According to an aspect of the present disclosure, an electronic component-embedded substrate includes a first wiring layer, a first electronic component disposed on the first wiring layer, a first insulating material covering at least a portion of each of the first wiring layer and the first electronic component, a second wiring layer disposed on the first insulating material, a second electronic component disposed on the second wiring layer and connected to the first electronic component in an electrical parallel connection, a second insulating material disposed on the first insulating material and covering at least a portion of each of the second wiring layer and the second electronic component, and a first via penetrating through the first insulating material and connecting the first electronic component and the second wiring layer.

According to another aspect of the present disclosure, an electronic component-embedded substrate includes a first insulating material enclosing one or more first electronic components; and a second insulating material disposed on the first insulating material and enclosing one or more second electronic components. The one or more first electronic components are connected to each other through a first wiring layer arranged on one side of the first insulating material. The one or more second electronic components are connected to each other through a second wiring layer arranged on another side of the first insulating material. The one or more first electronic components are connected to the second wiring layer through a via. The one or more first electronic components are arranged to at least partially overlap the one or more second electronic components, respectively, in a stacking direction of the first and second insulating materials.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
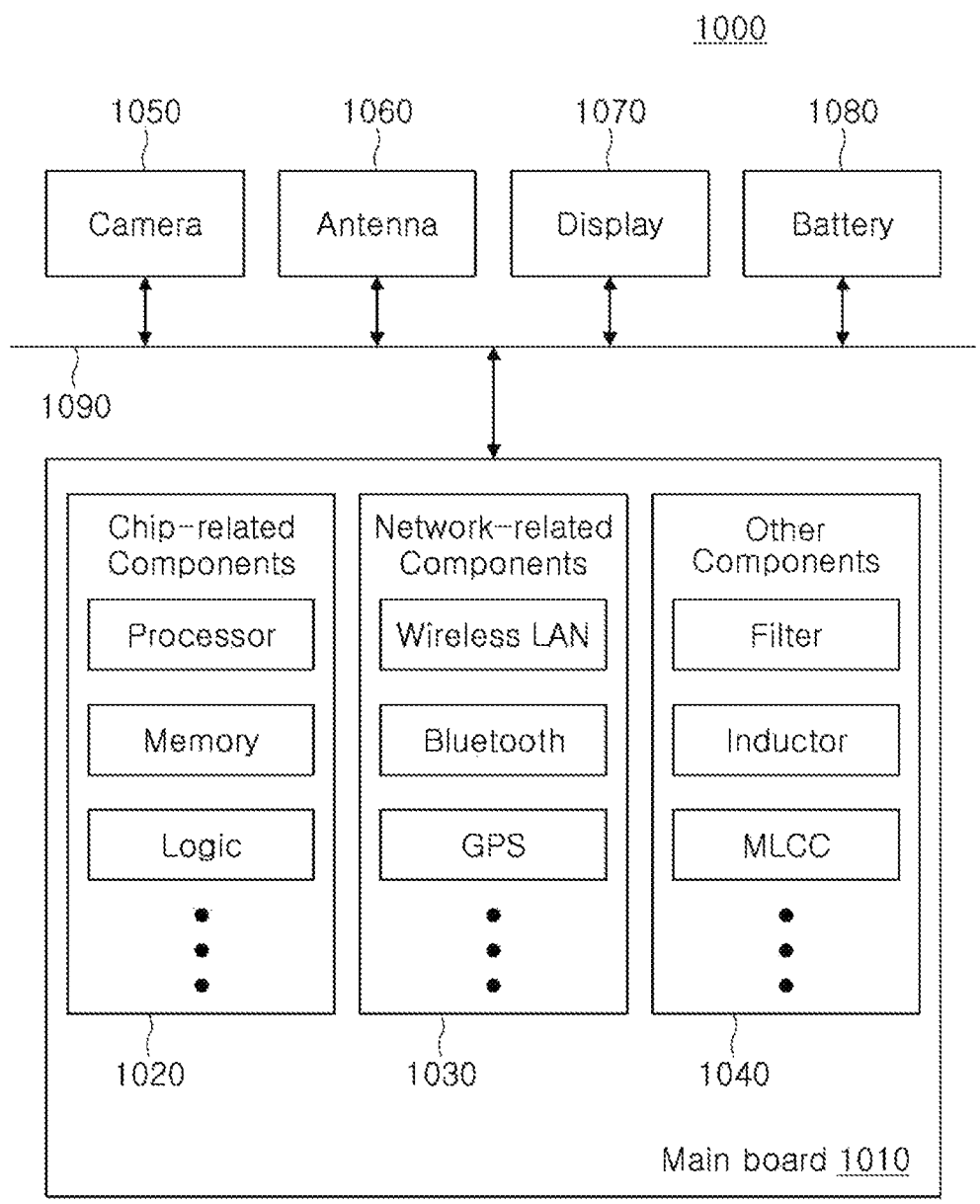
FIG. 1 schematically illustrates an example of a block diagram of an electronic system according to one exemplary embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the electronic components 1020 may be combined with each other. The chip related component 1020 may have the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related electronic components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may also be combined with the chip-related electronic component 1020 and/or the network-related electronic component 1030.

Depending on a type of the electronic device 1000, the electronic device 1000 may include other electronic components that may or may not be physically or electrically connected to the mainboard 1010. These other components may include, for example, a camera module 1050, an antenna module 1060, a display device 1070, a battery 1080 and the like, but are not limited thereto. For example, these other components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, other electronic components used for various uses depending on a type of electronic device 1000, or the like may be used.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
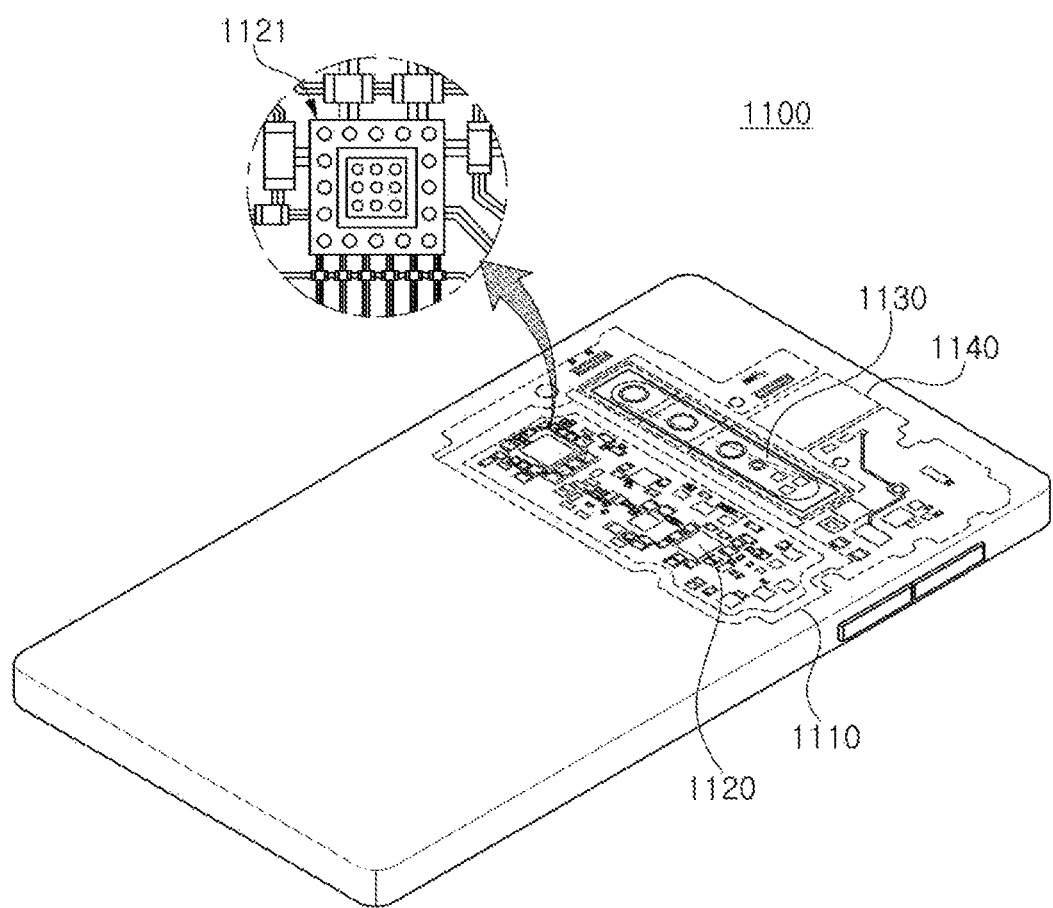
FIG. 2 is a schematic perspective view of an electronic device according to an exemplary embodiment.

FIG. 2 is a schematic perspective view of an electronic device according to an example.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other electronic components that may or may not be physically or electrically connected to the mainboard 1110, such as a camera module 1130 and/or a speaker 1140, may be accommodated therein. Some of the electronic components 1120 may be the chip related components, for example, a semiconductor package 1121, but are not limited thereto. The semiconductor package 1121 may be a surface mounted type in which a device such as a semiconductor chip or a passive component is mounted on a package substrate having a multilayer electronic component-embedded substrate, but is not limited thereto. On the other hand, the electronic device is not necessarily limited to the smartphone 1100, and may be another electronic device as described above.

Electronic Component-Embedded Substrate

Figure 3:
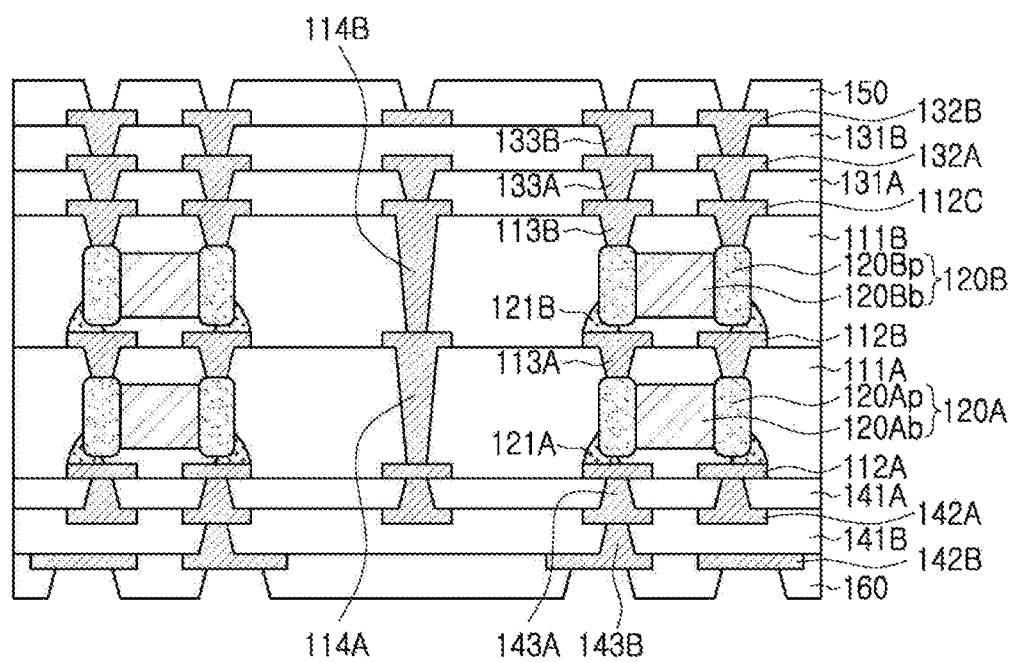
FIG. 3 is a schematic cross-sectional view of an electronic component-embedded substrate according to an exemplary embodiment.

FIG. 3 is a schematic cross-sectional view of an electronic component-embedded substrate according to an example.

Referring to FIG. 3, an electronic component-embedded substrate according to an example includes a base substrate 110, an electronic component 120 embedded in the base substrate 110 through a connection conductor 121, a first build-up structure 130 disposed on one side of the base substrate 110, a second build-up structure 140 disposed on the other side of the base substrate 110, a first passivation layer 150 disposed on the first build-up structure 130, and a second passivation layer 160 disposed on the second build-up structure 140. If necessary, the electronic component-embedded substrate may further include an electrical connection metal (not illustrated) disposed in an opening of each of the first passivation layer 150 and the second passivation layer 160.

In this specification, the meaning of being disposed on any component is not limited to the direction, but refers to being disposed on the upper side or the upper surface of any component. In some cases, the meaning of being disposed may be the case disposed on the lower side or lower surface of any component.

The base substrate 110 is an area in which the electronic component 120 is embedded. The base substrate includes a first wiring layer 112A, a first insulating material 111A covering the first wiring layer 112A, a second wiring layer 112B disposed on the first insulating material 111A, a first via 113A penetrating through the first insulating material 111A and connecting the second wiring layer 112B and a first electronic component 120A, a first through-via 114A penetrating through the first insulating material 111A and connecting the first wiring layer 112A and the second wiring layer 112B, a second insulating material 111B disposed on the first insulating material 111A and covering the second wiring layer 112B, a third wiring layer 112C disposed on the second insulating material 111B, a second via 113B penetrating through the second insulating material 111B and connecting the third wiring layer 112C and a second electronic component 120B, and a second through-via 114B penetrating through the second insulating material 111B and connecting the second wiring layer 112B and the third wiring layer 112C.

The first electronic component 120A is mounted on the first wiring layer 112A through the first connection conductor 121A and covered with the first insulating material 111A. In addition, as described above, the first electronic component 120A may be connected to the second wiring layer 112B by the first via 113A penetrating through the first insulating material 111A. On the other surface, which is the opposite surface of one surface of the first insulating material 111A on which the second insulating material 111B is disposed, the first insulating material 111A and the first wiring layer 112A may be coplanarized. Therefore, the first wiring layer 112A may be exposed on the first insulating material 111A.

The second electronic component 120B is mounted on the second wiring layer 112B through the second connection conductor 121B and is covered with the second insulating material 111B. In addition, as described above, the second electronic component 120B may be connected to the third wiring layer 112C by the second via 113B penetrating through the second insulating material 111B. On the surface of the second insulating material 111B on which the first insulating material 111A is disposed, the second insulating material 111B and the second wiring layer 112C may be coplanarized. Therefore, the second wiring layer 112B may be exposed on the second insulating material 111B.

The first electronic component 120A may be mounted on the first wiring layer 112A through surface mount technology (SMT) through the first connection conductor 121A.

Similarly, the second electronic component 120B may be mounted on the second wiring layer 112B through surface mount technology (SMT) through the second connection conductor 121B.

The first electronic component 120A and the second electronic component 120B may be connected to each other through the first via 113A and the second wiring layer 112B. In this case, as described below, the first electronic component 120A and the second electronic component 120B may be connected in parallel. The first via 113A and the second wiring layer 112B are disposed at a level between the first electronic component 120A and the second electronic component 120B, so that the first electronic component 120A and the second wiring layer 112B do not pass through another wiring layer. The second electronic component 120B may be directly connected.

The first electronic component 120A and the second electronic component 120B are disposed in the thickness direction. At this time, on the plane, the first electronic component 120A and the second electronic component 122B may be disposed in such a manner that the first electronic component 120A and the second electronic component 122B may overlap each other in the thickness direction.

As illustrated in the figure, each of the first electronic component 120A and the second electronic component 120B may be a plurality of electronic components. In this case, each of the plurality of first electronic components 120A may be spaced apart from each other by a predetermined distance. In addition, the space between each of the plurality of first electronic components 120A may be filled with the first insulating material 111A so that each of the plurality of first electronic components 120A may be spaced apart from each other by the first insulating material 111A. In addition, the plurality of second electronic components 120B may also be disposed in the same or similar manner as the plurality of first electronic components 120A described above.

The first electronic component 120A and the second electronic component 120B may be connected to a semiconductor package (not illustrated) mounted on the electronic component-embedded substrate through the wiring layers 132A and 132B included in the first build-up structure 130. Therefore, an electrical connection path between the first electronic component 120A and/or the second electronic component 120B and the semiconductor package (not illustrated) may be shortened. In addition, electrical signal loss and the like may be significantly reduced.

On the other hand, in general, an electronic component embedded in a substrate is embedded to be biased to a side in which a semiconductor package (not illustrated) is mounted, to face the semiconductor package (not illustrated), to shorten a signal path with the semiconductor package (not illustrated) mounted on the electronic component-embedded substrate. In this case, the substrate may have an asymmetric structure by having an area in which an electronic component is mounted and an area in which the electronic component is not mounted, and thus warpage or the like may occur. In the case of the electronic component-embedded substrate according to an example of the present disclosure, the first electronic component 120A and the second electronic component 120B are not embedded to be biased to a side where the semiconductor package (not illustrated) is mounted, and are embedded in the base substrate 110 in the thickness direction approximately symmetrically. Therefore, the warpage of the substrate may be reduced.

On the other hand, as described below, the first electronic component 120A and the second electronic component 120B may be passive components each having an electrode. In this case, the electrodes of each of the first electronic component 120A and the second electronic component 120B may be connected to each other by the first via 113A and the second wiring layer 112B of the base substrate 110. In addition, electrodes of the first electronic component 120A and the second electronic component 120B may be connected in parallel. Therefore, the capacitance of the electronic component may be increased and/or the ESL (Equivalent Series Inductance) may be reduced, and the Power Integrity (PI) characteristic may be improved.

Figure 10:
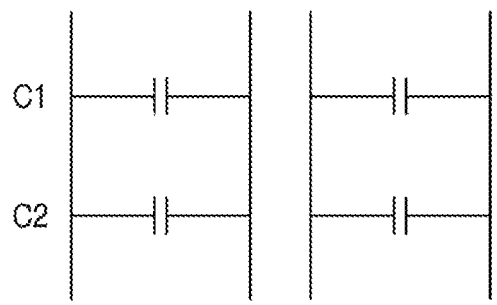
FIG. 10 is a schematic circuit diagram illustrating a circuit between electronic components included in an electronic component-embedded substrate according to an exemplary embodiment.

FIG. 10 schematically illustrates a circuit diagram of the first electronic component 120A and the second electronic component 120B. Here, the capacitance values of the first electronic component 120A and the second electronic component 120B are denoted by C1 and C2, respectively. As illustrated in the figure, as the first electronic component 120A and the second electronic component 120B are electrically connected to each other in parallel, the value of the total capacitance may be increased to C1+C2. At this time, as illustrated in the figure, each of the first electronic component 120A and the second electronic component 120B is illustrated as a plurality of electronic components.

The first build-up structure 130 includes a first insulating layer 131A, a first wiring layer 132A disposed on the first insulating layer 131A, a first via 133A penetrating through the first insulating layer 131A and connecting the first wiring layer 132A and the third wiring layer 112C of the base substrate 110 to each other, a second insulating layer 131B disposed on the first insulating layer 131A, a second wiring layer 132B disposed on the second insulating layer 131B, and a second via 133B penetrating through the second insulating layer 131B and connecting the second wiring layer 132B and the first wiring layer 132A.

The second build-up structure 140 includes a first insulating layer 141A, a first wiring layer 142A disposed on the first insulating layer 141A, a first via 143A penetrating through the first insulating layer 141A and connecting the first wiring layer 142A and the first wiring layer 112A of the base substrate 110 to each other, a second insulating layer 141B disposed on the first insulating layer 141A, a second wiring layer 142B disposed on the second insulating layer 141B, and a second via 143B penetrating through the second insulating layer 141B and connecting the second wiring layer 142B and the first wiring layer 142A.

Hereinafter, each configuration of the electronic component-embedded substrate according to an example will be described in more detail.

As described above, the base substrate 110 includes a first wiring layer 112A, a first insulating material 111A covering the first wiring layer 112A, a second wiring layer 112B disposed on the first insulating material 111A, a first via 113A penetrating through the first insulating material 111A and connecting the second wiring layer 112B and the first electronic component 120A, a first through-via 114A penetrating through the first insulating material 111A and connecting the first wiring layer 112A and the second wiring layer 112B, a second insulating material 111B disposed on the first insulating material 111A and covering the second wiring layer 112B, a third wiring layer 112C disposed on the second insulating material 111B, a second via 113B penetrating through the second insulating material 111B and connecting the third wiring layer 112C and the second electronic component 120B, and a second through-via 114B penetrating through the second insulating material 111B and connecting the second wiring layer 112B and the third wiring layer 112C.

However, the structure of the base substrate 110 is not limited thereto, and the base substrate 110 may be changed as much as possible by those skilled in the art. For example, the number of insulating layers, wiring layers, and/or vias included in the base substrate 110 may be more or less than that illustrated in the drawings.

The forming material of each of the first insulating material 111A and the second insulating material 111B is not particularly limited, and any material may be used as long as it has insulating properties. For example, thermosetting resins such as epoxy resins, thermoplastic resins such as polyimide, or resins in which these resins further contain reinforcing materials such as inorganic fillers and/or glass cloths (Glass Cloth, Glass Fabric), for example, Legs (prepreg), Ajinomoto Build-up Film (ABF), FR-4, Bismaleimide Triazine (BT) and the like may be used. If necessary, Photo Imagable Dielectric (PID) resins may be used.

The forming materials of each of the first insulating material 111A and the second insulating material 111B may be the same or different from each other. In addition, the thickness of each of the first insulating material 111A and the second insulating material 111B may be the same or may be different from each other.

The boundary between the first insulating material 111A and the second insulating material 111B may not be distinguished from each other according to a material, a process, or the like of the first insulating material 111A and the second insulating material 111B. For example, the first insulating material 111A and the second insulating material 111B are integrated with each other during the lamination process, or the boundary surface is unclear, so it may be difficult to visually check the boundary surface of the completed electronic component-embedded substrate structure.

Examples of the material for forming the first wiring layer 112A, the second wiring layer 112B, and the third wiring layer 112C include a conductive material such as copper (Cu), aluminum (Al), silver (Ag), tin (Sn), gold (Au), nickel (Ni), lead (Pb), titanium (Ti), or alloys thereof. Each of the first wiring layer 112A, the second wiring layer 112B, and the third wiring layer 112C may perform various functions according to a design. For example, a wiring pattern such as a ground (GrouND) pattern, a power (PoWeR: PWR) pattern, a signal (S) pattern, or the like may be included. In this case, the signal S pattern includes various signals except for a ground GND pattern and a power PWR pattern, for example, a data signal. In addition, a via pad or the like is included.

Examples of the material for forming the first via 113A and the second via 113B include a conductive material such as copper (Cu), aluminum (Al), silver (Ag), tin (Sn), gold (Au), nickel (Ni), lead (Pb), titanium (Ti), or alloys thereof. Each of the first via 113A and the second via 113B may be completely filled with a conductive material, or the conductive material is formed along the walls of the vias to form the first via 113A and the second via 113B. In the case in which the via is formed by forming the conductive material along the wall of the via hole, the inside of the via hole may be filled with an insulating material. In addition, as the shape of each of the first via 113A and the second via 113B, all shapes known in the art, such as a tapered shape and a cylindrical shape, may be used.

The first via 113A may have a structure integrated with the second wiring pattern 112B connected to the first via 113A. The second via 113B may have a structure integrated with the third wiring pattern 112C connected to the second via 113B.

Examples of the material for forming the first through-via 114A and the second through-via 114B include a conductive material such as copper (Cu), aluminum (Al), silver (Ag), tin (Sn), gold (Au), nickel (Ni), lead (Pb), titanium (Ti), or alloys thereof. Each of the first through-via 114A and the second through-via 114B may be formed by completely filling the via hole with a conductive material, or may be formed along the wall of the via hole. When the conductive material is formed along the walls of the via holes, when the first through-via 114A or the second through-via 114B is formed, the inside of the via hole may be filled with an insulating material as illustrated in the drawing. In addition, as the shape of each of the first through-via 114A and the second through-via 114B, all shapes known in the art, such as a tapered shape and a cylindrical shape, may be applied.

The first through-via 114A may have a structure integrated with the second wiring pattern 112B connected to the first through-via 114A. The second through-via 114B may have a structure integrated with the third wiring pattern 112C connected to the second through-via 114B.

Each of the first electronic component 120A and the second electronic component 122B may be a chip-type capacitor having electrodes. For example, the first electronic component 120A and the second electronic component 122B may be multi-layer ceramic capacitors (MLCCs), but are not limited thereto. In addition, as described above, the electrodes of each of the first electronic component 120A and the second electronic component 122B may be electrically connected in parallel. For example, each of the first electronic component 120A and the second electronic component 122B may include a first electrode and a second electrode, and each of the first electronic component 120A and the second electronic component 122B may be formed. One electrode may be connected to each other, and a second electrode of each of the first electronic component 120A and the second electronic component 122B may be connected to each other.

However, one embodiment is not limited thereto, and each of the first electronic component 120A and the second electronic component 122B may be a passive component such as an inductor, and may be an active component such as an integrated circuit (IC) or a semiconductor chip.

Each of the first connection conductor 121A and the second connection conductor 121B may include a solder or a conductive paste. However, the present invention is not limited thereto, and any material may be used as the material for forming each of the first connection conductor 124a and the second connection conductor 124b.

As described above, the first build-up structure 130 includes a first insulating layer 131A, a first wiring layer 132A disposed on the first insulating layer 131A, a first via 133A penetrating through the first insulating layer 131A and connecting the first wiring layer 132A and the third wiring layer 112C of the base substrate 110 to each other, a second insulating layer 131B disposed on the first insulating layer 131A, a second wiring layer 132B disposed on the second insulating layer 131B, and a second via 133B penetrating through the second insulating layer 131B and connecting the second wiring layer 132B and the first wiring layer 132A.

However, the structure of the first build-up structure 130 is not limited thereto, and may be changed as many as possible by those skilled in the art. For example, the number of insulating layers, wiring layers, and/or vias included in the first build-up structure 130 may be more or less than that illustrated in the drawings.

The forming material of each of the first insulating layer 131A and the second insulating layer 131B is not particularly limited, and any material may be used as long as it has insulating properties. For example, thermosetting resins such as epoxy resins, thermoplastic resins such as polyimide, or resins in which these resins further contain reinforcing materials such as inorganic fillers and/or glass cloths (Glass Cloth, Glass Fabric), for example, Legs (prepreg), Ajinomoto Build-up Film (ABF), FR-4, Bismaleimide Triazine (BT) and the like may be used. If necessary, Photo Imagable Dielectric (PID) resins may be used.

The boundary between the first insulating layer 131A and the second insulating layer 131B may not be distinguished from each other according to a material and a process of each of the first insulating layer 131A and the second insulating layer 131B. For example, it may be difficult to visually determine the boundary surface of the completed electronic component-embedded substrate structure because the first insulating layer 131A and the second insulating layer 131B are integrated with each other or the interface between them is unclear.

In addition, the boundary between the first insulating layer 131A and the second insulating material 111B may not be distinguished from each other according to the materials and processes of the first insulating layer 131A and the second insulating material 111B. For example, the lamination process may be difficult to visually check the boundary surface of the electronic component-embedded substrate structure because the first insulating layer 131A and the second insulating material 111B are integrated with each other or the interface is unclear.

The thickness of the first insulating layer 131A and the second insulating layer 131B may be less than the thickness of the first insulating material 111A and the second insulating material 111B of the base substrate 110 on which the electronic component 120 is embedded, respectively.

The material for forming each of the first wiring layer 132A and the second wiring layer 132B is copper (Cu), aluminum (Al), silver (Ag), tin (Sn), gold (Au), nickel (Ni), and lead. A conductive material such as (Pb), titanium (Ti), or alloys thereof may be used. Each of the first wiring layer 132A and the second wiring layer 132B may perform various functions according to a design. For example, the first wiring layer 132A and the second wiring layer 132B may include wiring patterns such as a ground (GrouND) pattern, a power (PoWeR: PWR) pattern, a signal (S) pattern, and the like. In this case, the signal S pattern includes various signals except for a ground GND pattern and a power PWR pattern, for example, a data signal. In addition, the first wiring layer 132A and the second wiring layer 132B include a via pad or the like.

Materials for forming the first via 133A and the second via 133B include a conductive material such as copper (Cu), aluminum (Al), silver (Ag), tin (Sn), gold (Au), nickel (Ni), lead (Pb), titanium (Ti), or alloys thereof. Each of the first via 133A and the second via 133B may be completely filled with a conductive material, or the conductive material is formed along the walls of the vias so that the first via 133A and the second via 133B are formed. When the via is formed by the conductive material being formed along the wall of the via hole, the inside of the via hole may be filled with an insulating material. In addition, all shapes known in the art, such as a tapered shape and a cylindrical shape, may be applied to the shapes of each of the first via 133A and the second via 133B.

The first via 133A may have a structure integrated with the first wiring pattern 132A connected to the first via 133A. The second via 133B may have a structure integrated with the second wiring pattern 132B connected to the second via 133B.

As described above, the second build-up structure 140 includes a first insulating layer 141A, a first wiring layer 142A disposed on the first insulating layer 141A, a first via 143A penetrating through the first insulating layer 141A and connecting the first wiring layer 142A and the first wiring layer 112A of the base substrate 110 to each other, a second insulating layer 141B disposed on the first insulating layer 141A, a second wiring layer 142B disposed on the second insulating layer 141B, and a second via 143B penetrating through the second insulating layer 141B and connecting the second wiring layer 142B and the first wiring layer 142A.

However, the structure of the second build-up structure 140 is not limited thereto, and may be changed as many as possible by those skilled in the art. For example, the number of insulating layers, wiring layers, and/or vias included in the second build-up structure 140 may be more or less than illustrated in the drawings.

The material for forming each of the first insulating layer 141A and the second insulating layer 141B is not particularly limited, and any material may be used as long as it has insulating properties. For example, thermosetting resins such as epoxy resins, thermoplastic resins such as polyimide, or resins in which these resins further contain reinforcing materials such as inorganic fillers and/or glass cloths (Glass Cloth, Glass Fabric), for example, Legs (prepreg), Ajinomoto Build-up Film (ABF), FR-4, Bismaleimide Triazine (BT) and the like may be used. If necessary, Photo Imagable Dielectric (PID) resins may be used.

The boundary between the first insulating layer 141A and the second insulating layer 141B may not be distinguished from each other depending on the materials and processes of the first insulating layer 141A and the second insulating layer 141B. For example, the electronic component-embedded substrate is completed because the first insulating layer 141A and the second insulating layer 141B are integrated with each other or the interface between the first insulating layer 141A and the second insulating layer 141B is unclear during the lamination process. It may be difficult to identify the interface visually in the structure.

In addition, the boundary between the first insulating layer 141A and the first insulating material 111A may also not be distinguished from each other according to materials and processes of the first insulating layer 141A and the first insulating material 111A. For example, during the lamination process, the first insulating layer 141A and the first insulating material 111A may be integrated with each other, or the interface therebetween may become unclear, and thus it may be difficult to visually determine the interface between the completed electronic component-embedded substrate structure.

The thickness of the first insulating layer 141A and the second insulating layer 141B may be less than the thickness of the first insulating material 111A and the second insulating material 111B of the base substrate 110 in which the electronic component 120 is embedded, respectively.

As the material for forming each of the first wiring layer 142A and the second wiring layer 142B, a conductive material such as copper (Cu), aluminum (Al), silver (Ag), tin (Sn), gold (Au), nickel (Ni), lead (Pb), titanium (Ti), or alloys thereof may be used. Each of the first wiring layer 142A and the second wiring layer 142B may perform various functions according to a design. For example, the first wiring layer 142A and the second wiring layer 142B may include wiring patterns such as a ground (GrouND) pattern, a power (PoWeR: PWR) pattern, a signal (S) pattern, and the like. In this case, the signal S pattern includes various signals except for a ground GND pattern and a power PWR pattern, for example, a data signal. In addition, the first wiring layer 142A and the second wiring layer 142B include a via pad or the like.

Materials for forming the first via 143A and the second via 143B include a conductive material such as copper (Cu), aluminum (Al), silver (Ag), tin (Sn), gold (Au), nickel (Ni), lead (Pb), titanium (Ti), or alloys thereof. Each of the first via 143A and the second via 143B may be completely filled with a conductive material, or the first via 143A and the second via 143B may be formed by forming a conductive material along a wall of the via. In the case in which the via is formed by forming the conductive material along the wall of the via hole, the inside of the via hole may be filled with an insulating material. In addition, any shape known in the art may be used as the shape of each of the first via 143A and the second via 143B.

The first via 143A may have a structure integrated with the first wiring pattern 142A connected to the first via 143A. The second via 143B may have a structure integrated with the second wiring pattern 142B connected to the second via 143B.

The first passivation layer 150 and the second passivation layer 160 may protect the internal structure of the electronic component-embedded substrate according to an example from external physical and chemical damages, etc. The first passivation layer 150 and the second passivation layer 160 may include a thermosetting resin and an inorganic filler. For example, each of the first passivation layer 150 and the second passivation layer 160 may be an ABF layer, but is not limited thereto. For example, each of the first passivation layer 150 and the second passivation layer 160 may be a known photosensitive insulating layer, for example, a SR (Solder Resist) layer. The first passivation layer 150 and the second passivation layer 160 may include the same kind of material and may have substantially the same thickness as each other, but are not limited thereto. For example, the first passivation layer 150 and the second passivation layer 160 may have different thicknesses.

The first passivation layer 150 may have one or more openings (not illustrated) exposing at least a portion of the wiring layer 132B of the first build-up structure 130. In addition, the second passivation layer 160 may have one or more openings (not illustrated) exposing at least a portion of the wiring layer 142B of the second build-up structure 140. In this case, a surface treatment layer may be formed on each of the exposed wiring layers 132B and 142B. The surface treatment layer may be formed by, for example, gold plating, tin plating, silver plating, nickel plating, or the like. If necessary, the openings of each of the first passivation layer 150 and the second passivation layer 160 may include a plurality of via holes.

FIGS. 4A to 8 schematically illustrate a process of manufacturing an electronic component-embedded substrate according to an example.

Figure 4A:
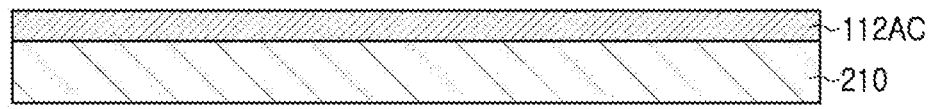
FIGS. 4A to 8 schematically illustrate a process of manufacturing an electronic component-embedded substrate according to an exemplary embodiment.
Figure 4B:
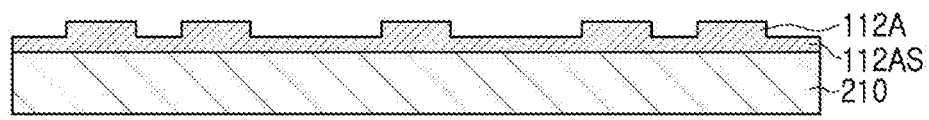
Figure 4C:
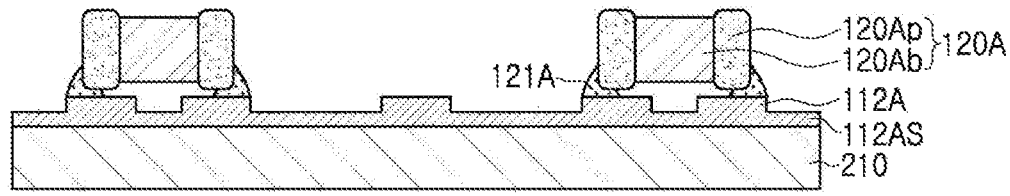
Figure 4D:
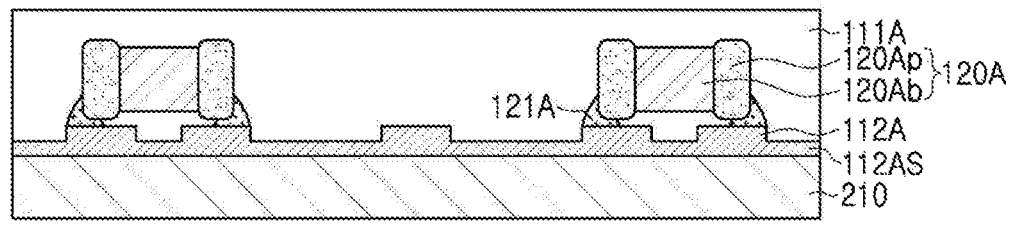

Referring to FIGS. 4A and 4B, the plating layer 112AC is formed on a carrier film 210 such as DCF, and patterned to form a first wiring layer 112A on the seed layer 112AS. Next, referring to FIGS. 4C and 4D, the first electronic component 120A is disposed on the first wiring layer 112A through the first connection conductor 121A, such as solder, and the like. 1 Seal with 111A insulating material.

The first wiring layer 112A may be formed by a known method. For example, sputtering, subtractive, additive, semi-additive process (SAP), modified semi-additive process (MSAP), or the like may be used.

The first insulating material 111A may be formed by a known method. For example, the precursor of the first insulating material 111A may be formed by lamination using a known lamination method and then cured, or may be formed by applying and curing the precursor material by a known coating method.

The first connection conductor 121A may be formed by a known method. For example, a solder or the like may be formed by a screen-printing method, a dispenser method or the like, or the like.

Figure 5A:
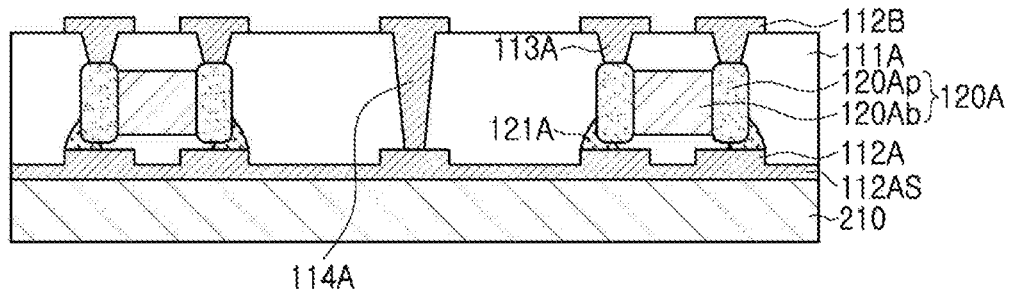
Figure 5B:
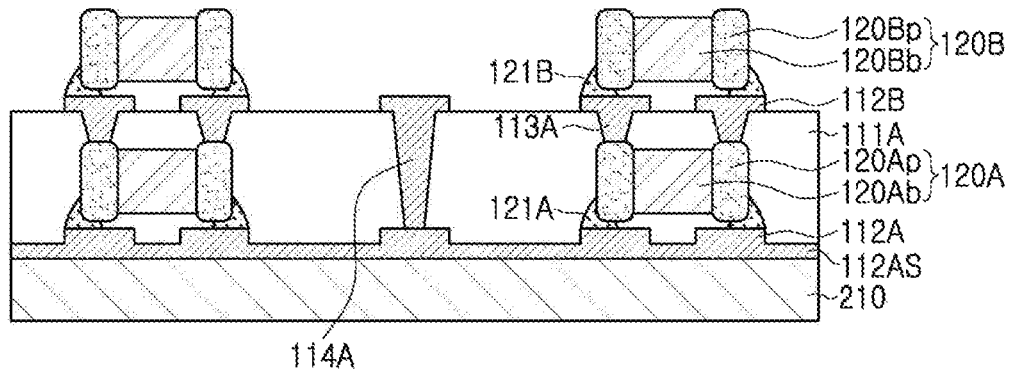
Figure 5C:
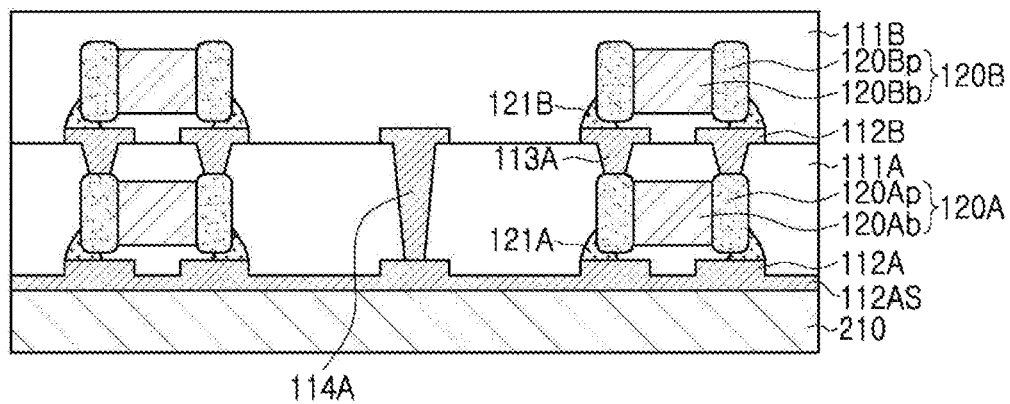

Referring to FIGS. 5A to 5C, the first via 113A, the first through-via 114A, and the second wiring layer 112B are formed. In addition, the second electronic component 120B is disposed on the second wiring layer 112B through the second connection conductor 121B such as solder and sealed with the second insulating material 111B. These formation methods are as above-mentioned.

Figure 6A:
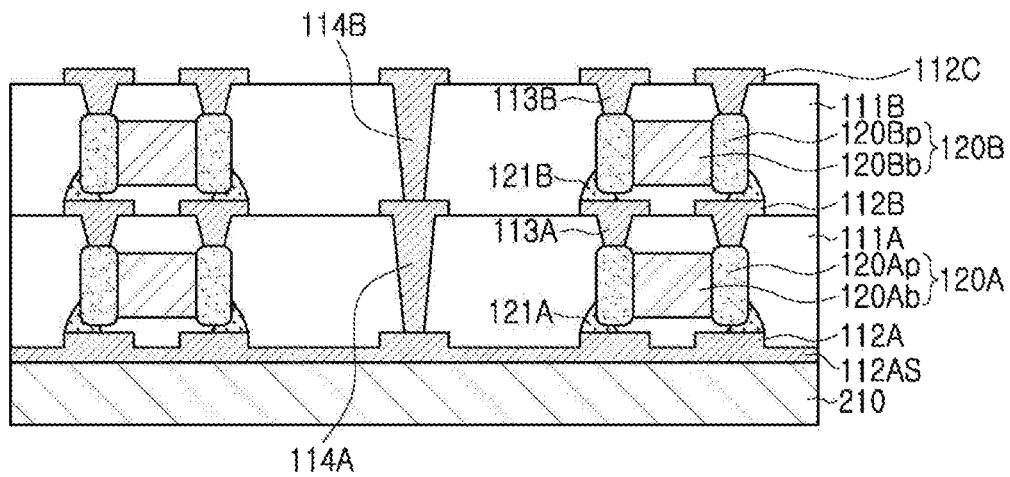
Figure 6B:
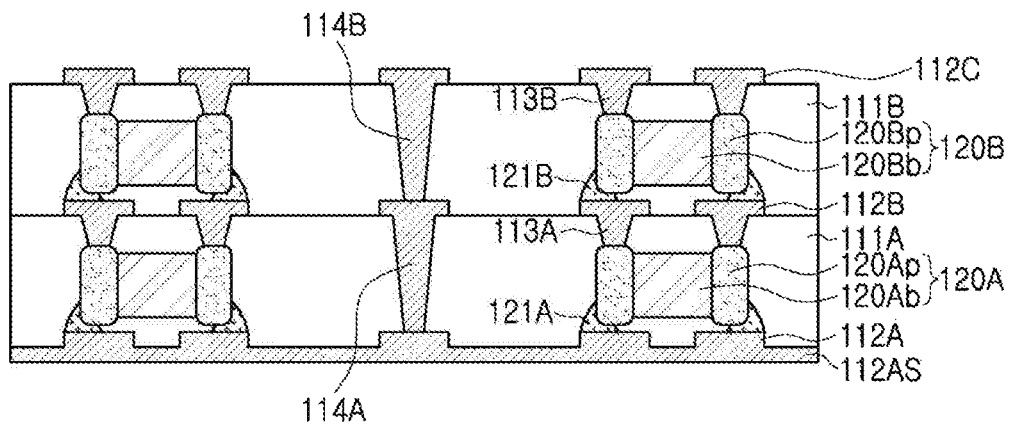
Figure 6C:
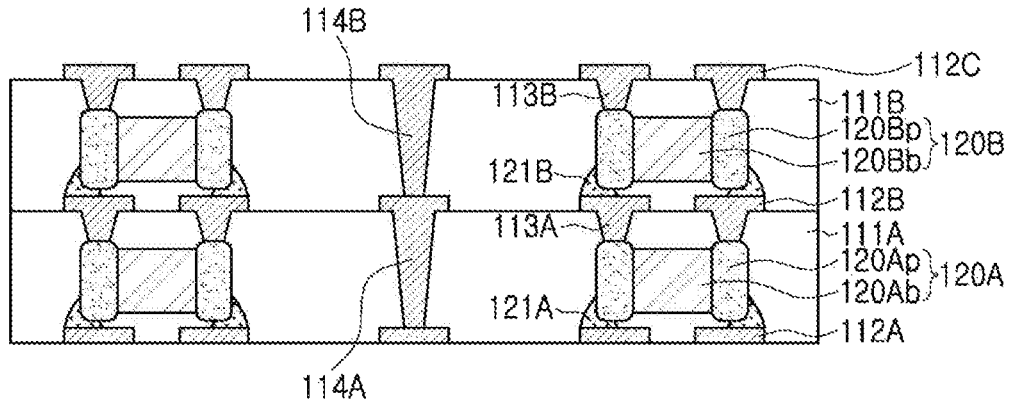

Referring to FIGS. 6A to 6C, the second via 113B, the second through-via 114B, and the third wiring layer 112C are formed. In addition, the carrier film 210 is peeled off and the seed layer 112AS is removed by a method such as etching.

Figure 7A:
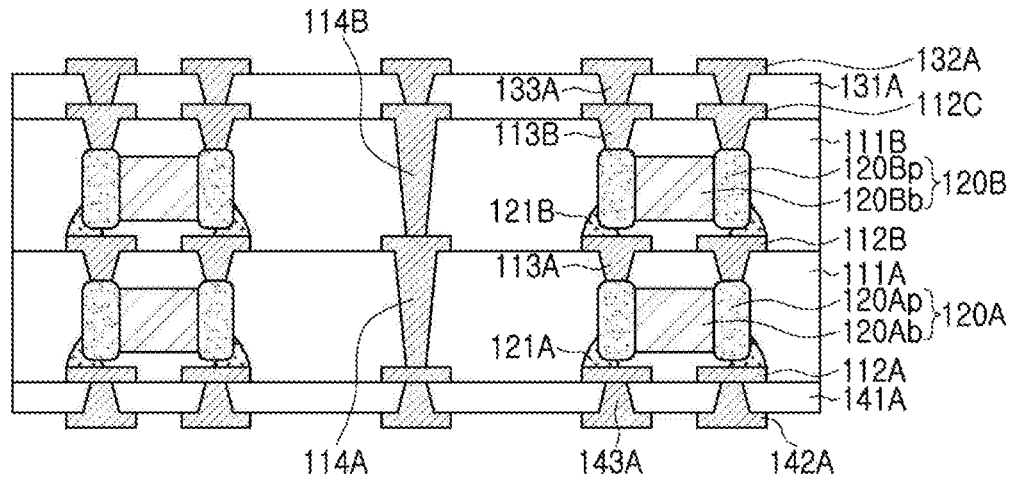
Figure 7B:
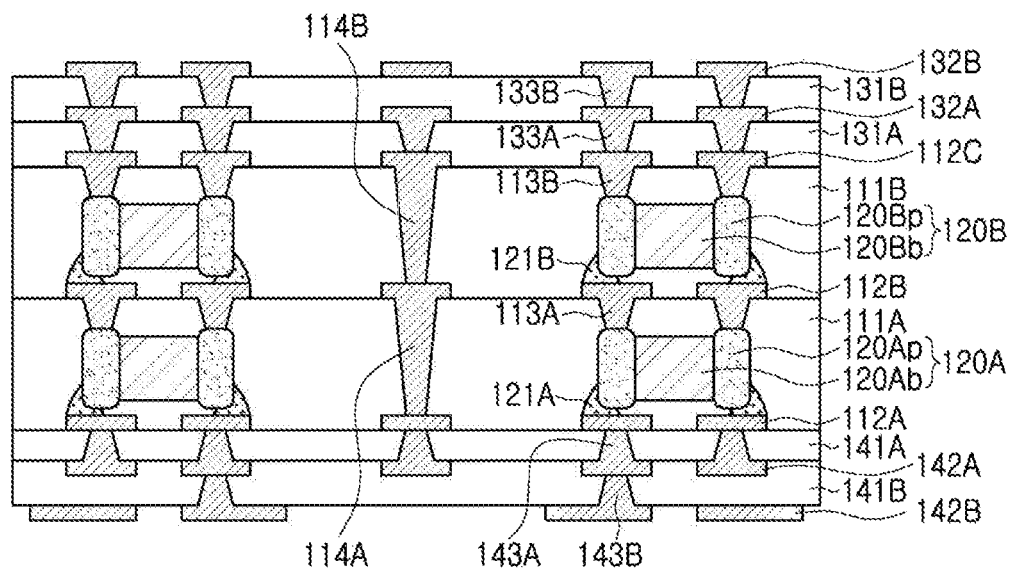

Referring to FIGS. 7A and 7B, the first insulating layers 131A and 141A, the first vias 133A and 143A, and first wiring layers 132A and 142A of the first build-up structure 130 and the second build-up structure 140, respectively, are formed. In addition, the second insulating layers 131B and 141B, the second vias 133B and 143B, and the second wiring layers 132B and 142B of the first build-up structure 130 and the second build-up structure 140, respectively, are formed. These formation methods are also as mentioned above.

Figure 8:
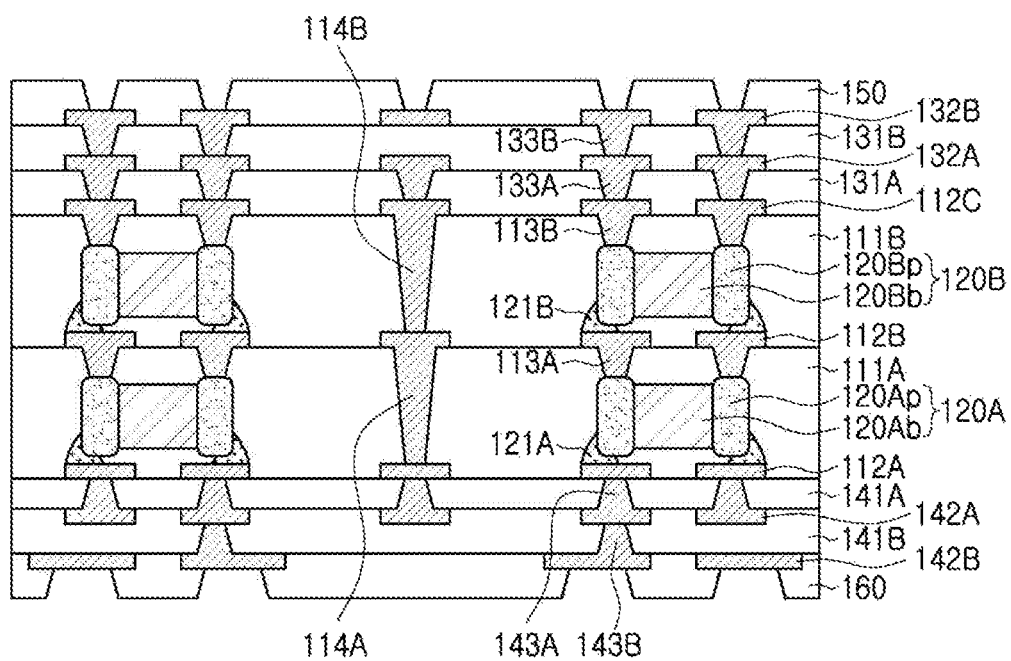

Referring to FIG. 8, the first passivation layer 150 and the second passivation layer 160 are formed.

Each of the first passivation layer 150 and the second passivation layer 160 may also be formed by a known method. For example, the precursor of each of the first passivation layer 150 and the second passivation layer 160 may be laminated, and may be formed by a method of post-curing, a method of applying the material for forming the passivation layer 250 and then curing.

Figure 9:
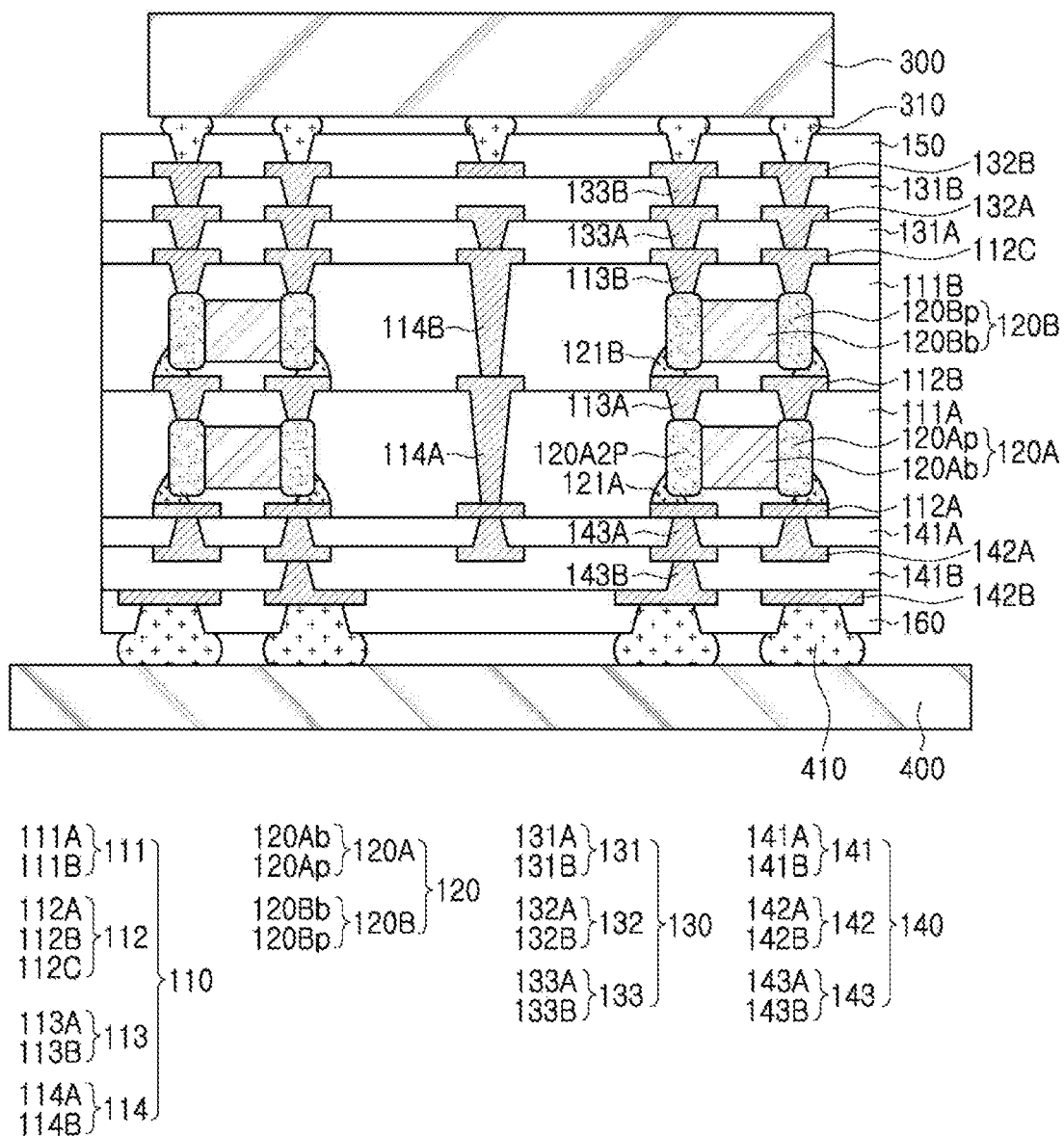
FIG. 9 is a schematic cross-sectional view illustrating an example in which a semiconductor package is mounted on an electronic component-embedded substrate according to an exemplary embodiment.

FIG. 9 is a schematic cross-sectional view of an example in which a semiconductor package is mounted on an electronic component-embedded substrate according to an example.

Referring to the drawings, in the case of using the above-described electronic component-embedded substrate according to the present disclosure, the semiconductor package 300 is mounted on the electronic component-embedded substrate through the electrical connection metal 310, wherein the embedded electronic component 120 may be electrically connected to a semiconductor chip (not illustrated) included in the semiconductor package 300 by a relatively short electrical path.

In addition, the semiconductor package 300 may have a form in which a semiconductor chip (not illustrated) is mounted on a separate interposer substrate and packaged, but is not limited thereto.

The semiconductor chip (not illustrated) may be an application specific integrated circuit (ASIC) and/or a high bandwidth memory (HBM), but is not limited thereto.

The electrical connection metal 310 may be made of a low melting metal, for example, an alloy including tin (Sn) or tin (Sn). More specifically, the electrical connection metal 310 may be formed of solder or the like, but this is only an example and the material is not particularly limited thereto.

In addition, if necessary, the electrical connection metal 310 may be fixed with an under-fill resin.

On the other hand, the electronic component-embedded substrate may be mounted on a substrate 400 such as a mainboard through a separate electrical connection metal 410.

As set forth above, according to an embodiment, an electronic component-embedded substrate having a shortened electrical connection path may be provided.

An electronic component-embedded substrate having improved power integrity (PI) characteristics due to an increase in capacitance of an electronic component and/or a decrease in equivalent series inductance (ESL) may be provided.

An electronic component-embedded substrate in which warpage is reduced may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component-embedded substrate comprising:
   a first wiring layer;
   a first electronic component disposed on the first wiring layer;
   a first insulating material covering at least a portion of each of the first wiring layer and the first electronic component;
   a second wiring layer disposed on the first insulating material;
   a second electronic component disposed on the second wiring layer and connected to the first electronic component in an electrical parallel connection;
   a second insulating material disposed on the first insulating material and covering at least a portion of each of the second wiring layer and the second electronic component; and
   a first via penetrating through the first insulating material and connecting the first electronic component and the second wiring layer,
   wherein the first electronic component and the second electronic component are a first passive component and a second passive component, respectively, that are connected to each other in the electrical parallel connection, and
   the first and second passive components are electrically connected to a wiring layer disposed above the second passive component and to a wiring layer below the first passive component.

2. The electronic component-embedded substrate of claim 1, wherein the first electronic component is mounted on the first wiring layer through a first connection conductor,
   the second electronic component is mounted on the second wiring layer through a second connection conductor, and
   the first connection conductor and the second connection conductor each comprise solder.

3. The electronic component-embedded substrate of claim 1, wherein the second wiring layer is arranged between the first electronic component and the second electronic component in a stacking direction of the first and second insulating materials.

4. The electronic component-embedded substrate of claim 1, further comprising a through-via penetrating through the first insulating material and connecting the first wiring layer and the second wiring layer.

5. The electronic component-embedded substrate of claim 1, wherein each of the first electronic component and the second electronic component includes a capacitor having an electrode.

6. The electronic component-embedded substrate of claim 5, wherein each of the first electronic component and the second electronic component includes a first electrode and a second electrode,
   the first electrode of the first electronic component is connected to the first electrode of the second electronic component, and
   the second electrode of the first electronic component is connected to the second electrode of the second electronic component.

7. The electronic component-embedded substrate of claim 1, wherein the first electronic component and the second electronic component are provided as a plurality of first electronic components and a plurality of second electronic components, respectively,
   wherein the plurality of first electronic components are arranged to be spaced apart from each other by a predetermined distance, and
   wherein the plurality of second electronic components are arranged to be spaced apart from each other by a predetermined distance.

8. The electronic component-embedded substrate of claim 1, wherein on a plane, the second electronic component is arranged to overlap the first electronic component in a stacking direction of the first and second insulating materials.

9. The electronic component-embedded substrate of claim 1, further comprising a third wiring layer disposed on the second insulating material and connected to the second electronic component.

10. The electronic component-embedded substrate of claim 9, further comprising a second via penetrating through the second insulating material and connecting the second electronic component and the third wiring layer.

11. The electronic component-embedded substrate of claim 9, further comprising a through-via penetrating through the second insulating material and connecting the second wiring layer and the third wiring layer.

12. The electronic component-embedded substrate of claim 9, further comprising:
    a first build-up structure disposed on the second insulating material and including a first insulating layer and a fourth wiring layer; and
    a second build-up structure disposed on the first insulating material and including a second insulating layer and a fifth wiring layer,
    wherein the fourth wiring layer is connected to the third wiring layer, and
    the fifth wiring layer is connected to the first wiring layer.

13. The electronic component-embedded substrate of claim 12, wherein the fourth wiring layer is disposed on the first insulating layer and connected to the third wiring layer through a third via, and
    the fifth wiring layer is disposed on the second insulating layer and connected to the first wiring layer through a fourth via.

14. The electronic component-embedded substrate of claim 12, further comprising a first passivation layer and a second passivation layer disposed on the first build-up structure and the second build-up structure, respectively.

15. The electronic component-embedded substrate of claim 12, wherein thicknesses of the first insulating layer and the second insulating layer are less than thicknesses of the first insulating material and the second insulating material, respectively.

16. The electronic component-embedded substrate of claim 1, wherein the first insulating material and the first wiring layer are coplanar with each other on a surface of the first insulating material, opposite to an interfacial surface between the first insulating material and the second insulating material.

17. An electronic package comprising:
the electronic component-embedded substrate of claim 1;
a semiconductor package mounted on the electronic component-embedded substrate through at least one first electrical connection metal; and
a mainboard on which the electronic component-embedded substrate is mounted through at least one second electrical connection metal.

18. An electronic component-embedded substrate comprising:
a first insulating material enclosing one or more first passive components; and
a second insulating material disposed on the first insulating material and enclosing one or more second passive components,
wherein the one or more first passive components are connected to each other through a first wiring layer arranged on one side of the first insulating material,
the one or more second passive components are connected to each other through a second wiring layer arranged on another side of the first insulating material,
the one or more first passive components are connected to the second wiring layer through a via,
the one or more first passive components are arranged to at least partially overlap the one or more second electronic components, respectively, in a stacking direction of the first and second insulating materials,
the one or more first passive components and the one or more second passive components are connected to each other in an electrical parallel connection, and
the one or more first passive components and the one or more second passive components are electrically connected to a wiring layer disposed above the one or more second passive components and to a wiring layer below the one or more first passive components.

19. The electronic component-embedded substrate of claim 18, further comprising a through-via penetrating through the first insulating material and connecting the first wiring layer and the second wiring layer.

20. An electronic component-embedded substrate comprising:
a first wiring layer;
a first electronic component disposed on the first wiring layer;
a first insulating material covering at least a portion of each of the first wiring layer and the first electronic component;
a second wiring layer disposed on the first insulating material;
a second electronic component disposed on the second wiring layer and connected to the first electronic component in an electrical parallel connection;
a second insulating material disposed on the first insulating material and covering at least a portion of each of the second wiring layer and the second electronic component; and
a first via penetrating through the first insulating material and connecting the first electronic component and the second wiring layer,
wherein lower portions of the first and second electronic components are connected to the first and second wiring layers by solders, respectively, and an upper portion of the first electronic component is connected to the second wiring layer by the first via.

\* \* \* \* \*